United States Patent
Hou

(10) Patent No.: US 10,818,866 B2
(45) Date of Patent: Oct. 27, 2020

(54) ORGANIC ELECTROLUMINESCENT DEVICE, PRODUCTION METHOD THEREOF, AND DISPLAY APPARATUS

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 179 days.

(21) Appl. No.: 15/991,536

(22) Filed: May 29, 2018

(65) Prior Publication Data

US 2019/0157601 A1 May 23, 2019

(30) Foreign Application Priority Data

Nov. 23, 2017 (CN) .......................... 2017 1 1181152

(51) Int. Cl.
| | | |
|---|---|---|
| *H01L 51/50* | (2006.01) | |
| *H01L 27/32* | (2006.01) | |
| *H01L 51/52* | (2006.01) | |
| *H01L 51/00* | (2006.01) | |
| *H01L 51/56* | (2006.01) | |

(52) U.S. Cl.
CPC ...... *H01L 51/5092* (2013.01); *H01L 27/3246* (2013.01); *H01L 51/0005* (2013.01); *H01L 51/5056* (2013.01); *H01L 51/5072* (2013.01); *H01L 51/5088* (2013.01); *H01L 51/5206* (2013.01); *H01L 51/5221* (2013.01); *H01L 51/56* (2013.01)

(58) Field of Classification Search
CPC ............ H01L 51/5088; H01L 27/3246; H01L 51/5092; H01L 51/5072; H01L 51/5056; H01L 51/5221; H01L 51/0005; H01L 51/5206; H01L 51/56; H01L 27/32
See application file for complete search history.

(56) References Cited

U.S. PATENT DOCUMENTS

| | | | | |
|---|---|---|---|---|
| 2005/0285509 A1* | 12/2005 | Funamoto | ........... | H01L 51/5275 313/504 |
| 2007/0172702 A1* | 7/2007 | Elschner | ................ | H05B 33/14 428/690 |
| 2019/0157580 A1* | 5/2019 | Yoon | .................... | H01L 51/0077 |

* cited by examiner

*Primary Examiner* — Hoang-Quan Ho
(74) *Attorney, Agent, or Firm* — Kinney & Lange, P.A.

(57) ABSTRACT

An organic electroluminescent device, a production method thereof, and a display apparatus are disclosed. Specifically, the organic electroluminescent device includes: a substrate; a pixel defining layer on the substrate; and a hole injection layer on the substrate, wherein the hole injection layer is located in a pixel defining opening of the pixel defining layer, wherein the hole injection layer includes a first hole injection sub-layer and a second hole injection sub-layer covering the first hole injection sub-layer, an orthographic projection area of the second hole injection sub-layer on the substrate is greater than the orthographic projection area of the first hole injection sub-layer on the substrate, and a hole mobility of the second hole injection sub-layer is greater than the hole mobility of the first hole injection sub-layer.

20 Claims, 3 Drawing Sheets

ORGANIC ELECTROLUMINESCENT DEVICE, PRODUCTION METHOD THEREOF, AND DISPLAY APPARATUS

CROSS-REFERENCE TO RELATED APPLICATION

This application claims the priority of Chinese Patent Application No. 201711181152.6 filed on Nov. 23, 2017, the contents of which are incorporated hereby as a part of this application by reference in its entirety.

TECHNICAL FIELD

This disclosure relates to the technical field of display, and particularly to an organic electroluminescent device, a production method thereof, and a display apparatus.

BACKGROUND

Compared to existing liquid crystal displays (LCDs), organic electroluminescent devices (OLEDs) have the advantages of self-light emission, short response time, wide view angle, high brightness, bright color, good lightness and thinness, and the like, and are well recognized to become a next-generation display technique in the industry.

SUMMARY

This disclosure provides an organic electroluminescent device, comprising:
a substrate;
a pixel defining layer on the substrate; and
a hole injection layer on the substrate, wherein the hole injection layer is located in a pixel defining opening of the pixel defining layer,
wherein the hole injection layer comprises a first hole injection sub-layer and a second hole injection sub-layer covering the first hole injection sub-layer,
an orthographic projection area of the second hole injection sub-layer on the substrate is greater than the orthographic projection area of the first hole injection sub-layer on the substrate, and
a hole mobility of the second hole injection sub-layer is greater than the hole mobility of the first hole injection sub-layer.

Optionally, the first hole injection sub-layer is made of a polyaniline or polythiophene material comprising a fluorine-containing material, and the second hole injection sub-layer is made of a polyaniline or polythiophene material.

Optionally, the fluorine-containing material is at least one selected from a group consisting of perfluorododecyl trichlorosilane, methyl fluoroacrylate, perfluorohexyloxy methane, fluorine-containing isocyanates, fluorine-containing polyurethanes, fluorine-containing alkylvinyl diols, fluorine-containing acid halides, and fluoroalkyl methacrylates.

Optionally, the first hole injection sub-layer has a thickness of 5 nm to 100 nm along a direction from the substrate toward the pixel defining layer.

Optionally, the first hole injection sub-layer is located in the middle portion of the pixel defining opening, and a surface of the first hole injection sub-layer away from the substrate has a dome shape.

Optionally, a surface of the second hole injection sub-layer away from the substrate has an inverted dome shape, and an edge of the second hole injection sub-layer is in contact with the pixel defining layer.

Optionally, a lowest point of a surface of the second hole injection sub-layer away from the substrate is equal to or higher than a highest point of a surface of the first hole injection sub-layer away from the substrate.

Optionally, the hole injection layer comprises a double layered structure composed of the first hole injection sub-layer and the second hole injection sub-layer.

Furthermore, this disclosure further provides a production method of any one of the organic electroluminescent devices as provided by the technical solutions described above, comprising steps of:
providing a substrate provided with a pixel defining layer;
performing a first surface treatment on the substrate;
forming a first hole injection sub-layer in a pixel defining opening of the pixel defining layer on the substrate, and performing a drying treatment;
performing a second surface treatment on the substrate on which the drying treatment has been performed; and
forming a second hole injection sub-layer in the pixel defining opening of the pixel defining layer on the substrate, and performing a drying treatment.

Optionally, in the step of performing a first surface treatment on the substrate, the first surface treatment is a plasma treatment or a self-assembling treatment.

Optionally, in the step of performing a first surface treatment on the substrate, performing the plasma treatment on the substrate by forming a plasma with a mixed gas containing $CF_4$ gas, or performing the self-assembling treatment on the substrate by using a mixed solution containing a fluorinated silane.

Optionally, in the step of performing second surface treatment on the substrate, the second surface treatment is a ultraviolet (UV) treatment.

Optionally, the first hole injection sub-layer and the second hole injection sub-layer are formed by using an ink-jet printing process.

Optionally, the first hole injection sub-layer is made of a polyaniline or polythiophene material comprising a fluorine-containing material, and the second hole injection sub-layer is made of a polyaniline or polythiophene material.

Optionally, the fluorine-containing material is at least one selected from a group consisting of perfluorododecyl trichlorosilane, methyl fluoroacrylate, perfluorohexyloxy methane, fluorine-containing isocyanates, fluorine-containing polyurethanes, fluorine-containing alkylvinyl diols, fluorine-containing acid halides, and fluoroalkyl methacrylates.

Optionally, the first hole injection sub-layer has a thickness of 5 nm to 100 nm along a direction from the substrate toward the pixel defining layer.

Optionally, the first hole injection sub-layer is located in the middle portion of the pixel defining opening, and a surface of the first hole injection sub-layer away from the substrate has a dome shape.

Optionally, a surface of the second hole injection sub-layer away from the substrate has an inverted dome shape, and an edge of the second hole injection sub-layer is in contact with the pixel defining layer.

Optionally, a lowest point of a surface of the second hole injection sub-layer away from the substrate is equal to or higher than a highest point of a surface of the first hole injection sub-layer away from the substrate.

Optionally, the hole injection layer comprises a double layered structure composed of the first hole injection sub-layer and the second hole injection sub-layer.

This disclosure further provides a display apparatus, comprising any one of the organic electroluminescent devices provided by the technical solutions described above.

DETAILED DESCRIPTION OF EMBODIMENTS

Figure 1:
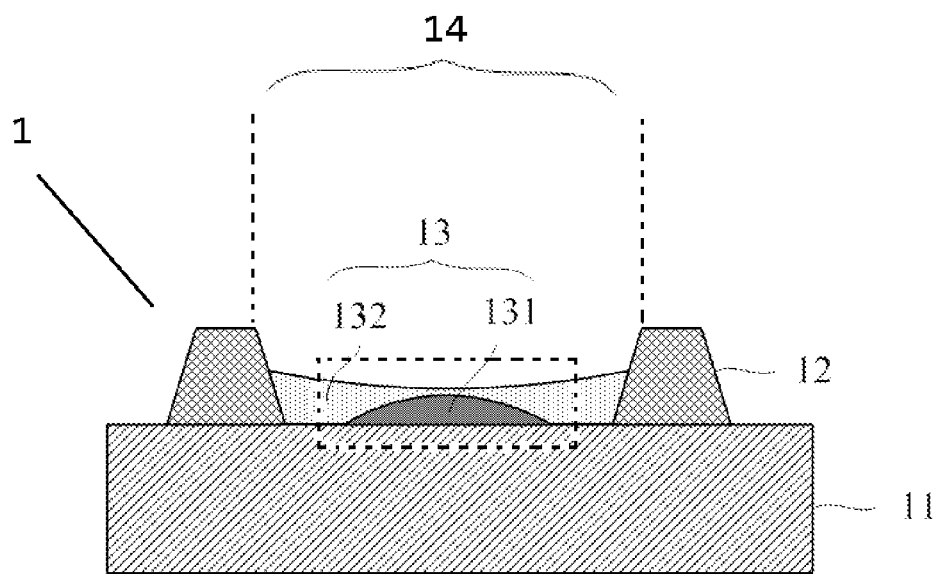
FIG. 1 is a structural schematic diagram of an organic electroluminescent device provided in an embodiment of this disclosure.

The technical solutions in embodiments of this disclosure will be clearly and fully described below in conjunction with accompanying drawings in embodiments of this disclosure. Obviously, the embodiments described are merely a part of the embodiments of this disclosure, rather than all of the embodiments. Based on the embodiments of this disclosure, all other embodiments obtained by those of ordinary skill in the art without performing inventive work belong to the scope protected by this disclosure.

In the process of producing an organic electroluminescent device, the thin film deposition methods mainly include vacuum deposition and solution process. When a hole injection layer is produced in a pixel by ink-jet printing with an ink, the ink will climb on the pixel defining layer to allow a thin film in the pixel to form a structure with relatively thick edges and a relatively thin center. When the organic electroluminescent device emits light, the center of the pixel has high brightness and the edge of the pixel has low brightness, resulting in a problem that the light emission evenness of the pixel is poor and in turn the display effect is impaired.

This disclosure provides an organic electroluminescent device, a production method thereof, and a display apparatus. This organic electroluminescent device has a hole injection layer with a multilayer structure and the multilayer structure has different hole mobilities, so as to solve the problem that the light emission evenness is poor and the display effect is impaired caused by the fact that the center of the pixel has high brightness and the edge of the pixel has low brightness when the organic electroluminescent device emits light. Therefore, the light emission evenness and the display effect of the organic electroluminescent device have been improved.

The hole injection layer of the organic electroluminescent device described above employs a multilayer structure, and comprises a first hole injection sub-layer and a second hole injection sub-layer. Therefore, when a hole injection layer is produced, it is possible to form a first hole injection sub-layer, then form a second hole injection sub-layer on the first hole injection sub-layer, and finally form a hole injection layer. Since the first hole injection sub-layer and the second hole injection sub-layer are separately produced, the surface areas and the thicknesses of the first hole injection sub-layer and the second hole injection sub-layer may be controlled in the process of production to allow the surface areas and the thicknesses of the first hole injection sub-layer and the second hole injection sub-layer to all reach preset values. According to the related art, it can be known that the migration speed of holes in the hole injection layer is directly proportional to the hole mobility and the electric field strength applied to the hole injection layer. In the case of the same electric field strength, the migration speed of the hole is directly proportional to the hole mobility. That is, the time in which the holes pass through the hole injection layer is the ratio of the thickness of the hole injection layer to the migration speed of the holes. Since the hole mobility of the second hole injection sub-layer is greater than the hole mobility of the first hole injection sub-layer, the structure of the organic electroluminescent device described above may allow the times in which the holes pass through the hole injection layer to be consistent by controlling the thicknesses and the hole mobilities of the first hole injection sub-layer and the second hole injection sub-layer.

Specifically, this disclosure provides an organic electroluminescent device, comprising:

a substrate;

a pixel defining layer on the substrate; and a hole injection layer on the substrate, wherein the hole injection layer is located in a pixel defining opening of the pixel defining layer, wherein the hole injection layer comprises a first hole injection sub-layer and a second hole injection sub-layer covering the first hole injection sub-layer, an orthographic projection area of the second hole injection sub-layer on the substrate is greater than the orthographic projection area of the first hole injection sub-layer on the substrate, and a hole mobility of the second hole injection sub-layer is greater than the hole mobility of the first hole injection sub-layer.

Therefore, although the ink will climb on the pixel defining layer to allow a thin film in the pixel to form a structure with relatively thick edges and a relatively thin center when a hole injection layer is produced by ink-jet printing, the thicknesses of the first hole injection sub-layer and the second hole injection sub-layer at the edge position and the intermediate position may be controlled since the hole injection layer employs a multilayer structure, and the hole mobility of the second hole injection sub-layer is greater than the hole mobility of the first hole injection sub-layer. Therefore, the same mobility time of holes in the hole injection layer may be achieved by adjusting the thicknesses and the hole mobilities at various positions of the hole injection layer to allow the light-emitting brightness at various positions of the pixel to be the same when the organic electroluminescent device emits light so as to improve the light emission evenness, which solves the problem that the light emission evenness is poor and the display effect is impaired caused by the fact that the center of the pixel has high brightness and the edge of the pixel has low brightness when the organic electroluminescent device emits light. Therefore, the light emission evenness and the display effect of the organic electroluminescent device have been improved.

Embodiments of this disclosure provide an organic electroluminescent device, a production method thereof, and a display apparatus, wherein this display apparatus comprises the organic electroluminescent device described above. With respect to the organic electroluminescent device described above, the same mobility time of holes in the hole injection layer may be achieved by adjusting the thicknesses and the hole mobilities at various positions of the hole injection layer to allow the light-emitting brightness at various positions of the pixel to be the same when the organic electroluminescent device emits light so as to improve the light emission evenness, which solves the problem that the light emission evenness is poor and the display effect is impaired caused by the fact that the center of the pixel has high brightness and the edge of the pixel has low brightness when the organic electroluminescent device emits light. Therefore, the light emission evenness and the display effect of the organic electroluminescent device have been improved. The display apparatus may be an OLED display apparatus, and may be particularly an electronic device with display function, such as a display, a cell phone, a tablet computer, a television, and the like.

Figure 2:
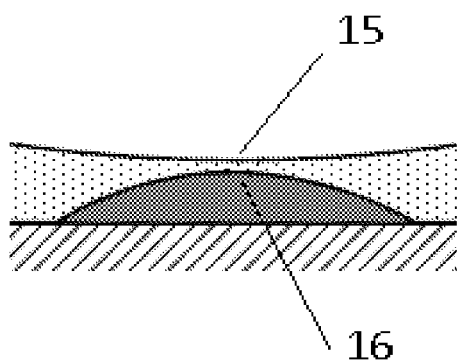
FIG. 2 is an enlarged schematic diagram of a part with a dashed frame in the structural schematic diagram of the organic electroluminescent device shown in FIG. 1.

Here, referring to FIG. 1 and FIG. 2, wherein FIG. 1 shows an organic electroluminescent device 1 provided in an embodiment of this disclosure, and FIG. 2 is an enlarged schematic diagram of a part with a dashed frame in the structural schematic diagram of the organic electroluminescent device shown in FIG. 1. The organic electroluminescent device 1 comprises: a substrate 11; a pixel defining layer 12 on the substrate 11; and a hole injection layer 13 the substrate 11, wherein the hole injection layer 13 is located in a pixel defining opening 14 of the pixel defining layer 12, wherein the hole injection layer 13 comprises a first hole injection sub-layer 131 on the substrate 11 and a second hole injection sub-layer 132 covering the first hole injection sub-layer 131, the orthographic projection area of the second hole injection sub-layer 132 on the substrate 11 is greater than the orthographic projection area of the first hole injection sub-layer 131 on the substrate 11, and the hole mobility of the second hole injection sub-layer 132 is greater than the hole mobility of the first hole injection sub-layer 131. The hole injection layer 13 has a double layered structure composed of the first hole injection sub-layer 131 and the second hole injection sub-layer 132. As shown by the structure in FIG. 1, the hole injection layer 13 comprises a first hole injection sub-layer 131 on the substrate 11 and a second hole injection sub-layer 132 on the first hole injection sub-layer 131. The first hole injection sub-layer 131 resides in the middle portion of a groove surrounded by the substrate 11 and the pixel defining layer 12, the second hole injection sub-layer 132 covers the groove surrounded by the substrate 11 and the pixel defining layer 12 to prevent the first hole injection sub-layer 131 from climbing along the pixel defining layer 12.

A plurality of pixel defining openings 14 are provided in the pixel defining layer 12, and the plurality of pixel defining openings 14 are in one-to-one correspondence with light-emitting areas of respective sub-pixel units.

The hole injection layer 13 of the organic electroluminescent device described above employs a double layered structure, and comprises a first hole injection sub-layer 131 and a second hole injection sub-layer 132. Therefore, when a hole injection layer 13 is produced, it is possible to form a first hole injection sub-layer 131, then form a second hole injection sub-layer 132 on the first hole injection sub-layer 131, and thus form a hole injection layer 13. Since the first hole injection sub-layer 131 and the second hole injection sub-layer 132 are separately produced, the surface areas and the thicknesses of the first hole injection sub-layer 131 and the second hole injection sub-layer 132 may be controlled in the process of production to allow the surface areas and the thicknesses of the first hole injection sub-layer 132 and the second hole injection sub-layer 131 to all reach preset values. According to the related art, it can be known that the migration speed of holes in the hole injection layer 13 is directly proportional to the hole mobility and the electric field strength applied to the hole injection layer 13. In the case of the same electric field strength, the migration speed of the hole is directly proportional to the hole mobility. That is, the time in which the holes pass through the hole injection layer 13 is the ratio of the thickness of the hole injection layer 13 to the migration speed of the holes. Since the hole mobility of the second hole injection sub-layer 132 is greater than the hole mobility of the first hole injection sub-layer 131, the structure of the organic electroluminescent device described above may allow the times in which the holes pass through the hole injection layer 13 to be consistent by controlling the thicknesses and the hole mobilities of the first hole injection sub-layer 131 and the second hole injection sub-layer 132.

Therefore, although the ink will climb on the pixel defining layer 12 to allow a thin film in the pixel to form a structure with relatively thick edges and a relatively thin center when a hole injection layer 13 is produced by ink-jet printing, the thicknesses of the first hole injection sub-layer 131 and the second hole injection sub-layer 132 at the edge position and the intermediate position may be controlled since the hole injection layer 13 employs a double layered structure, and the hole mobility of the second hole injection sub-layer 132 is greater than the hole mobility of the first hole injection sub-layer 131. Therefore, the same mobility time of holes in the hole injection layer 13 may be achieved by adjusting the thicknesses and the hole mobilities at various positions of the hole injection layer 13 to allow the light-emitting brightness at various positions of the pixel to be the same when the organic electroluminescent device emits light so as to improve the light emission evenness, which solves the problem that the light emission evenness is poor and the display effect is impaired caused by the fact that the center of the pixel has high brightness and the edge of the pixel has low brightness when the existing organic electroluminescent device emits light. Therefore, the light emission evenness and the display effect of the organic electroluminescent device have been improved.

In the above embodiments, the hole injection layer 13 of the organic electroluminescent device 1 has a double layered structure composed of the first hole injection sub-layer 131 and the second hole injection sub-layer 132. However, the technical solutions according to this disclosure are not limited thereto. That is, in addition to the first hole injection sub-layer 131 and the second hole injection sub-layer 132, the hole injection layer 13 may further comprise any other layer whose hole mobility is different from the hole mobility of the first hole injection sub-layer 131 and the hole mobility of the second hole injection sub-layer 132, as long as the above-mentioned technical effects of the technical solutions according to this application are not impaired.

In a particular embodiment, the first hole injection sub-layer 131 is made of a polyaniline or polythiophene material comprising a fluorine-containing material. The "polyaniline or polythiophene material comprising a fluorine-containing material" as stated herein refers to a mixed material obtained by mixing polyaniline or polythiophene as a bulk material with a fluorine-containing material. The fluorine-containing material may be at least one selected from a group consisting of perfluorododecyl trichlorosilane, methyl fluoroacrylate, perfluorohexyloxy methane, fluorine-containing isocyanates, fluorine-containing polyurethanes, fluorine-containing alkylvinyl diols, fluorine-containing acid halides, and fluoroalkyl methacrylates. That is, the fluorine-containing material used for producing the first hole injection sub-layer 131 may be one of above-mentioned various fluorine-containing materials, or may be an arbitrary combination of various materials such as a combination of two materials from the above-mentioned fluorine-containing materials.

The second hole injection sub-layer 132 is made of a polyaniline or polythiophene material.

In a particular production process, the first hole injection sub-layer 131 and second hole injection sub-layer 132 may employ a polyaniline or polythiophene material, or may also employ other conductive polymer materials.

Furthermore, as shown by the structure in FIG. 1, the thickness of first hole injection sub-layer 131 along a direction from the substrate 11 toward the pixel defining layer 12 is 5 nm to 100 nm. For example, the thickness of the first hole injection sub-layer 131 may be 5 nm, 10 nm, 15 nm, 20 nm, 25 nm, 30 nm, 35 nm, 40 nm, 45 nm, 50 nm, 55 nm, 60 nm, 65 nm, 70 nm, 75 nm, 80 nm, 85 nm, 90 nm, 95 nm, 100 nm.

Specifically, as shown by the structure in FIG. 1, the first hole injection sub-layer 131 is located in the middle portion of the pixel defining opening 14, and the surface of the first hole injection sub-layer 131 away from the substrate has a dome shape. Additionally, the surface of the second hole injection sub-layer 132 away from the substrate has an inverted dome shape, and the edge of the second hole injection sub-layer 132 is in contact with the edge of the pixel defining layer 12. Furthermore, the lowest point 15 of the surface of the second hole injection sub-layer 132 away from the substrate is equal to or higher than the highest point 16 of the surface of the first hole injection sub-layer 131 away from the substrate, as shown in FIG. 2.

The organic electroluminescent device described above not only comprises a hole injection layer, but also may comprise and is not limited to a first electrode, a hole transport layer (HTL), an emitting material layer (EML), an electron transport layer (ETL), an electron injection layer (EIL), and a second electrode. The hole injection layer may be located between the first electrode and the hole transport layer. For example, the organic electroluminescent device described above may comprise a first electrode, a hole injection layer, a hole transport layer, an emitting material layer, an electron transport layer, an electron injection layer, and a second electrode, in this order.

An embodiment of this disclosure further provides a display apparatus, comprising any one of the organic electroluminescent devices provided in the embodiments described above.

Figure 4:
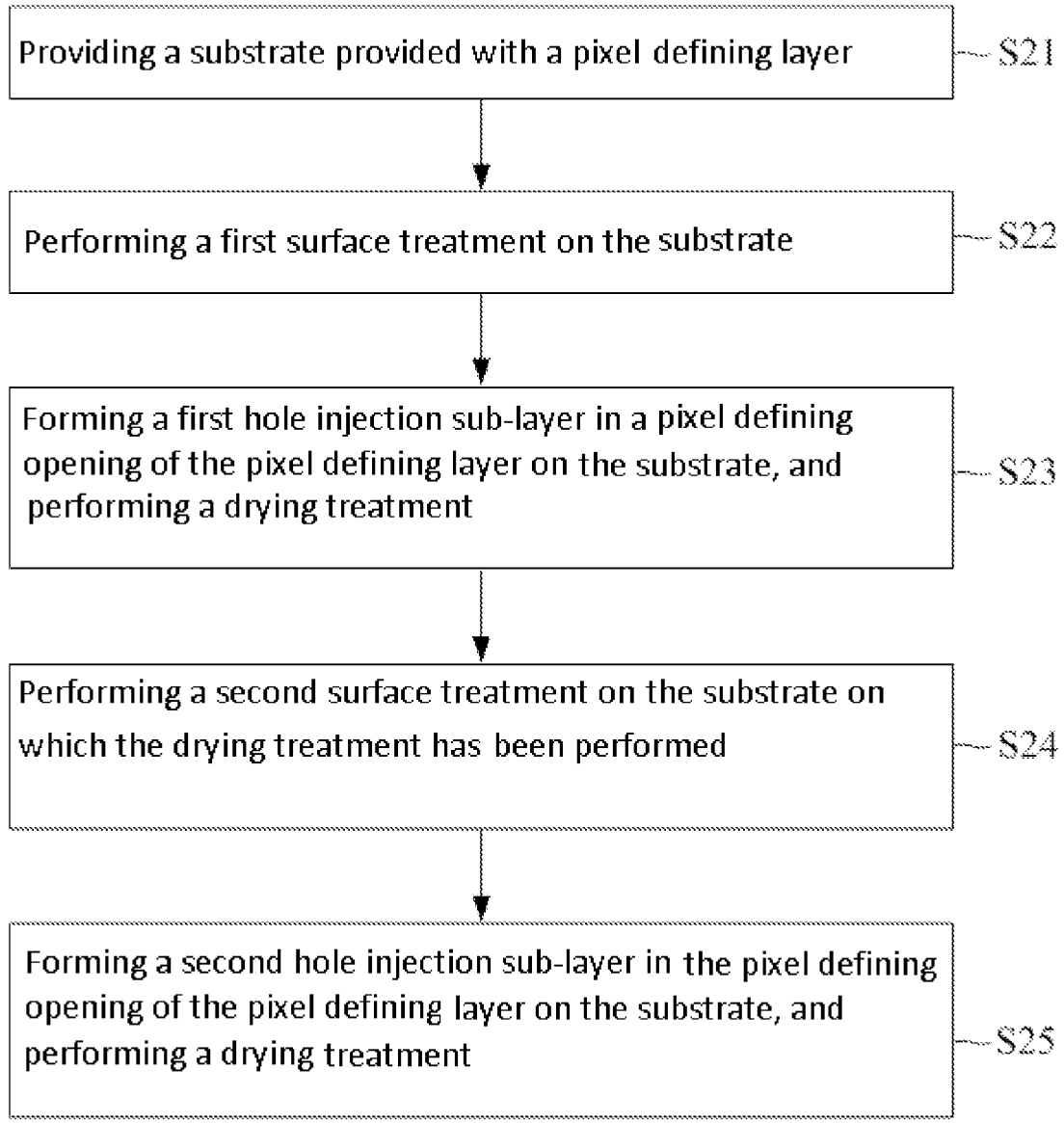
FIG. 4 is a process flow chart of a production method of an organic electroluminescent device provided in an embodiment of this disclosure.

As shown in FIG. 4, an embodiment of this disclosure further provides a production method of the organic electroluminescent device according to any one described above, comprising:

Step S21: providing a substrate provided with a pixel defining layer;

Step S22: performing a first surface treatment on the substrate;

Step S23: forming a first hole injection sub-layer in a pixel defining opening of the pixel defining layer on the substrate, and performing a drying treatment;

Step S24: performing a second surface treatment on the substrate on which the drying treatment has been performed; and Step S25: forming a second hole injection sub-layer in the pixel defining opening of the pixel defining layer on the substrate, and performing a drying treatment.

Figure 3A:
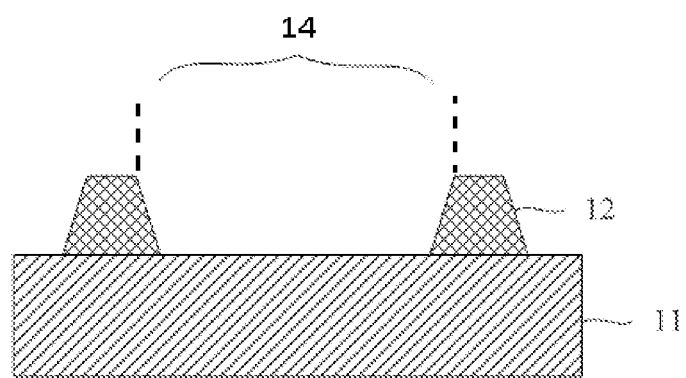
FIG. 3a-FIG. 3c are diagrams showing structure variations in the process of producing the organic electroluminescent device in FIG. 1.

Specifically, this production method comprises:

Step S21, providing a substrate 11 provided with a pixel defining layer 12. As shown by the structure in FIG. 3a, the pixel defining layer 12 is provided on the substrate 11, wherein a plurality of pixel defining openings (grooves) are formed by the pixel defining layer 12 and the substrate 11, and the plurality of pixel defining openings 14 are in one-to-one correspondence with light-emitting areas of respective sub-pixel units; and a first electrode may also be provided on the substrate 11.

Step S22, performing a first surface treatment on the substrate 11. The first surface treatment may be a plasma treatment or a self-assembling treatment. When the plasma treatment is performed on the substrate 11, a plasma may be formed with a mixed gas containing $CF_4$ gas; or the self-assembling treatment may be performed on the substrate 11 by using a mixed liquid containing fluorinated silane.

Figure 3B:
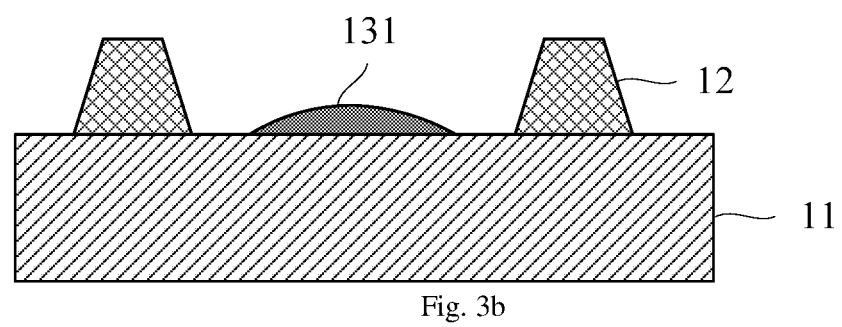

Step S23, forming a first hole injection sub-layer 131 in a pixel defining opening 14 of the pixel defining layer 12 on the substrate 11, and performing a drying treatment on the substrate 11. As shown by the structure in FIG. 3b, in the production process, the first hole injection sub-layer 131 may be formed on the substrate 11 by a method of ink-jet printing with an ink. The ink for producing the first hole injection sub-layer 131 may comprise a polyaniline or polythiophene material having a fluorine-containing material. The fluorine-containing material may be at least one selected from a group consisting of perfluorododecyl trichlorosilane, methyl fluoroacrylate, perfluorohexyloxy methane, fluorine-containing isocyanates, fluorine-containing polyurethanes, fluorine-containing alkylvinyl diols, fluorine-containing acid halides, and fluoroalkyl methacrylates. That is, the fluorine-containing material used for producing the first hole injection sub-layer 131 may be one of the above-mentioned various fluorine-containing materials, or may be an arbitrary combination of various materials such as a combination of two materials from the above-mentioned fluorine-containing materials. When the drying treatment is performed on the first hole injection sub-layer 131, the drying treatment methods of vacuum reduced-pressure drying, high temperature baking, room temperature drying, or low temperature reduced-pressure drying may be used, and other drying treatment methods may also be used.

Step S24, performing a second surface treatment on the substrate 11, wherein the second surface treatment may be UV treatment.

Figure 3C:
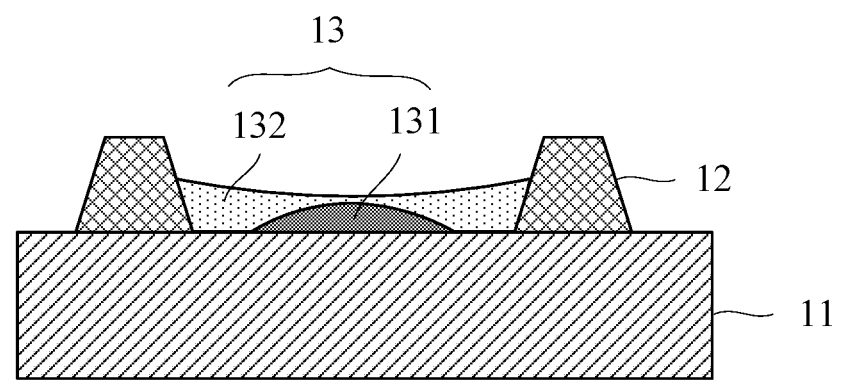

Step S25, forming a second hole injection sub-layer 132 in a pixel defining opening 14 of the pixel defining layer 12 on the substrate 11, and performing a drying treatment on the substrate 11. As shown by the structure in FIG. 3c, the material for producing the second hole injection sub-layer 132 may be a polyaniline or polythiophene material. When the drying treatment is performed on the second hole injection sub-layer 132, the drying treatment methods of vacuum reduced-pressure drying, high temperature baking, room temperature drying, or low temperature reduced-pressure drying may be used, and other drying treatment methods may also be used.

When the organic electroluminescent device is produced by using the production method described above, since the surface treatment, by which the surface energy of the surface of the substrate 11 may be reduced (for example, when an electrode made of ITO (indium tin oxide) is provided on the surface of the substrate 11, the surface energy of the ITO electrode may be reduced), is performed on the substrate 11 before the first hole injection sub-layer 131 of the hole injection layer 13 is produced, it allows that the ink-jet printed material of the first hole injection sub-layer 131 will not freely flow and completely spread so as to reduce the coverage area of the first hole injection sub-layer 131 and achieve the control over the coverage area of the first hole injection sub-layer 131. At the meanwhile, by producing the second hole injection sub-layer 132 after drying and film-forming is performed on the first hole injection sub-layer 131, the first hole injection sub-layer 131 may be cured and the variations in the thickness and the area of the first hole injection sub-layer 131 are prevented in the process of producing the second hole injection sub-layer 132, so as to have a more precise control effect on the pixel and improve the control over the display effect. After the first hole injection sub-layer 131 is formed, a second surface treatment, such as UV treatment, is performed on the substrate 11 formed with the first hole injection sub-layer 131. $CF_4$ or fluorinated silane remaining upon the first surface treatment of the substrate 11 may be removed, and the fluorinated material in the first hole injection sub-layer 131 may also be promoted to freely move to the surface of the first hole injection sub-layer 131.

Therefore, the organic electroluminescent device produced by the production method described above may allow the times in which the holes pass through the hole injection layer 13 to remain the same by controlling the provision positions and the thicknesses of the first hole injection sub-layer 131 and the second hole injection sub-layer 132, to allow the light-emitting brightness at various positions in each pixel to be consistent when the organic electroluminescent device emits light. The light emission evenness and the display effect of the organic electroluminescent device have been improved.

Optionally, in Step S22 of performing a first surface treatment on the substrate 11, the first surface treatment is a plasma treatment or a self-assembling treatment.

Optionally, in Step S22 of performing first surface treatment on the substrate 11, when the plasma treatment is performed on the substrate 11, a plasma may be formed with a mixed gas containing $CF_4$ gas; or the self-assembling treatment may be performed on the substrate 11 by using a mixed liquid containing fluorinated silane.

Optionally, in Step S24 of performing a second surface treatment on the substrate 11, the second surface treatment is a ultraviolet (UV) treatment.

Optionally, in Step S23 of forming a first hole injection sub-layer 131 in a pixel defining opening 14 of the pixel defining layer 12 on the substrate 11, the first hole injection sub-layer 131 is formed by using an ink-jet printing process; and in Step S25 of forming a second hole injection sub-layer 132 in a pixel defining opening 14 of the pixel defining layer 12 on the substrate 11, the second hole injection sub-layer 132 is formed by using an ink-jet printing process.

Before Step S21 of providing a substrate 11 provided with a pixel defining layer 12, the method may further comprise:
 forming a first electrode on a base; and
 forming a pixel defining layer 12 on the first electrode.

After Step S25 of performing a drying treatment on the substrate 11, the method may further comprise:
 forming a hole transport layer, an organic light emitting layer, an electron transport layer, an electron injection layer, and a second electrode, in this order, on the hole injection layer 13. The first electrode may be an anode or a cathode; and correspondingly, the second electrode is a cathode or an anode.

Compared to the prior art, this disclosure has the following advantageous effects.

This disclosure provides an organic electroluminescent device, a production method thereof, and a display apparatus, wherein the hole injection layer of the organic electroluminescent device is a multilayer structure having a second hole injection sub-layer and a first hole injection sub-layer, the orthographic projection area of the second hole injection sub-layer on the substrate is greater than the orthographic projection area of the first hole injection sub-layer on the substrate, and the hole mobility of the second hole injection sub-layer is greater than the hole mobility of the first hole injection sub-layer. Therefore, with respect to the organic electroluminescent device described above, the same mobility time of holes in the hole injection layer may be achieved by adjusting the thicknesses and the hole mobilities at various positions of the hole injection layer to allow the light-emitting brightness at various positions of the pixel to be the same when the organic electroluminescent device emits light so as to improve the light emission evenness, which solves the problem that the light emission evenness is poor and the display effect is impaired caused by the fact that the center of the pixel has high brightness and the edge of the pixel has low brightness when the existing organic electroluminescent device emits light. Therefore, the light emission evenness and the display effect of the organic electroluminescent device have been improved.

Obviously, various modifications and variations may be made to the embodiments of this disclosure by the person skilled in the art without deviating from the spirit and the scope of this disclosure. Thus, if these modifications and variations of this disclosure are within the scope of the claims of this disclosure and equivalent techniques thereof, this disclosure also intends to encompass these modifications and variations.

What is claimed is:

1. An organic electroluminescent device, comprising:
 a substrate;
 a pixel defining layer on the substrate; and
 a hole injection layer on the substrate, wherein the hole injection layer is located in a pixel defining opening of the pixel defining layer,
 wherein the hole injection layer comprises a first hole injection sub-layer and a second hole injection sub-layer covering the first hole injection sub-layer,
 wherein an orthographic projection area of the second hole injection sub-layer on the substrate is greater than an orthographic projection area of the first hole injection sub-layer on the substrate,
 wherein a hole mobility of the second hole injection sub-layer is greater than a hole mobility of the first hole injection sub-layer, and
 wherein thicknesses and hole mobilities of the first hole injection sub-layer and the second hole injection sub-layer at various positions of the hole injection layer are controlled so that times in which holes pass through the hole injection layer are consistent.

2. The organic electroluminescent device according to claim 1, wherein the first hole injection sub-layer is made of a polyaniline or polythiophene material comprising a fluorine-containing material, and the second hole injection sub-layer is made of a polyaniline or polythiophene material.

3. The organic electroluminescent device according to claim 2, wherein the fluorine-containing material is at least one selected from a group consisting of perfluorododecyl trichlorosilane, methyl fluoroacrylate, perfluorohexyloxy methane, fluorine-containing isocyanates, fluorine-containing polyurethanes, fluorine-containing alkylvinyl diols, fluorine-containing acid halides, and fluoroalkyl methacrylates.

4. The organic electroluminescent device according to claim 1, wherein the first hole injection sub-layer has a thickness of 5 nm to 100 nm along a direction from the substrate toward the pixel defining layer.

5. The organic electroluminescent device according to claim 1, wherein the first hole injection sub-layer is located in a middle portion of the pixel defining opening, and a surface of the first hole injection sub-layer away from the substrate has a dome shape.

6. The organic electroluminescent device according to claim 1, wherein a surface of the second hole injection sub-layer away from the substrate has an inverted dome shape, and an edge of the second hole injection sub-layer is in contact with the pixel defining layer.

7. The organic electroluminescent device according to claim 1, wherein a lowest point of a surface of the second hole injection sub-layer away from the substrate is equal to or higher than a highest point of a surface of the first hole injection sub-layer away from the substrate.

8. The organic electroluminescent device according to claim 1, wherein the hole injection layer consists of a double layered structure composed of the first hole injection sub-layer and the second hole injection sub-layer.

9. A production method of the organic electroluminescent device according to claim 1, comprising:
providing the substrate with the pixel defining layer thereon;
performing a first surface treatment on the substrate;
forming the first hole injection sub-layer in the pixel defining opening of the pixel defining layer on the substrate, and performing a drying treatment;
performing a second surface treatment on the substrate on which the drying treatment has been performed; and
forming the second hole injection sub-layer in the pixel defining opening of the pixel defining layer on the substrate, and performing a drying treatment,
wherein thicknesses and hole mobilities of the first hole injection sub-layer and the second hole injection sub-layer at various positions of the hole injection layer are controlled so that times in which holes pass through the hole injection layer are consistent.

10. The production method according to claim 9, wherein in the step of performing the first surface treatment on the substrate, the first surface treatment is a plasma treatment or a self-assembling treatment.

11. The production method according to claim 10, wherein in the step of performing the first surface treatment on the substrate, the first surface treatment comprises performing the plasma treatment on the substrate by forming a plasma with a mixed gas containing $CF_4$ gas, or performing the self-assembling treatment on the substrate by using a mixed solution containing a fluorinated silane.

12. The production method according to claim 9, wherein in the step of performing the second surface treatment on the substrate, the second surface treatment is an ultraviolet treatment.

13. The production method according to claim 9, wherein the first hole injection sub-layer and the second hole injection sub-layer are formed by using an ink-jet printing process.

14. The production method according to claim 9, wherein the first hole injection sub-layer is made of a polyaniline or polythiophene material comprising a fluorine-containing material, and the second hole injection sub-layer is made of a polyaniline or polythiophene material.

15. The production method according to claim 14, wherein the fluorine-containing material is at least one selected from a group consisting of perfluorododecyl trichlorosilane, methyl fluoroacrylate, perfluorohexyloxy methane, fluorine-containing isocyanates, fluorine-containing polyurethanes, fluorine-containing alkylvinyl diols, fluorine-containing acid halides, and fluoroalkyl methacrylates.

16. The production method according to claim 9, wherein the first hole injection sub-layer has a thickness of 5 nm to 100 nm along a direction from the substrate toward the pixel defining layer.

17. The production method according to claim 9, wherein the first hole injection sub-layer is located in a middle portion of the pixel defining opening, and a surface of the first hole injection sub-layer away from the substrate has a dome shape.

18. The production method according to claim 9, wherein a surface of the second hole injection sub-layer away from the substrate has an inverted dome shape, and an edge of the second hole injection sub-layer is in contact with the pixel defining layer.

19. The production method according to claim 9, wherein a lowest point of a surface of the second hole injection sub-layer away from the substrate is equal to or higher than a highest point of a surface of the first hole injection sub-layer away from the substrate.

20. A display apparatus, comprising the organic electroluminescent device according to claim 1.

* * * * *